(12) United States Patent
Alley et al.

(10) Patent No.: US 8,756,023 B2
(45) Date of Patent: Jun. 17, 2014

(54) SYSTEMS AND METHODS FOR DETERMINING ELECTRICAL GROUND FAULTS

(75) Inventors: Daniel Milton Alley, Salem, VA (US); Parag Vishwanath Acharya, Hyderabad (IN)

(73) Assignee: General Electric Company, Schenectady, NY (US)

( * ) Notice: Subject to any disclaimer, the term of this patent is extended or adjusted under 35 U.S.C. 154(b) by 360 days.

(21) Appl. No.: 13/180,103

(22) Filed: Jul. 11, 2011

(65) Prior Publication Data

US 2012/0299598 A1 Nov. 29, 2012

Related U.S. Application Data

(63) Continuation-in-part of application No. 13/116,869, filed on May 26, 2011.

(51) Int. Cl.
*G01R 31/00* (2006.01)
*G01R 31/14* (2006.01)
*H02H 3/00* (2006.01)

(52) U.S. Cl.
USPC ............................. 702/58; 324/509; 361/42

(58) Field of Classification Search
USPC ............ 702/58, 57, 59, 64–65, 81, 84, 108, 702/117–118, 127, 182–183, 185, 189; 324/500, 509, 512, 522–523, 525, 527, 324/537; 700/286, 292–293; 361/15, 18, 361/42, 93.7
See application file for complete search history.

(56) References Cited

U.S. PATENT DOCUMENTS

| | | | |
|---|---|---|---|
| 5,481,194 A * | 1/1996 | Schantz et al. | 324/522 |
| 6,135,085 A | 10/2000 | Toyohara et al. | |
| 7,019,532 B2 | 3/2006 | Glockner et al. | |
| 2008/0269970 A1 | 10/2008 | Yamada | |
| 2012/0303297 A1* | 11/2012 | Alley et al. | 702/58 |

* cited by examiner

*Primary Examiner* — Toan Le
(74) *Attorney, Agent, or Firm* — Sutherland Asbill & Brennen LLP

(57) ABSTRACT

Certain embodiments of the invention may include systems and methods for determining electrical ground faults. According to an example embodiment of the invention, a method is provided determining ground leakage electrical faults. The method includes providing a voltage source having a positive lead in communication with a first contact conductor and a negative lead in communication with a second field conductor, wherein the first contact conductor is connected to a ground through a first resistor Rp, and wherein the second field conductor is connected to the ground through a second resistor Rn; monitoring a first voltage potential associated with the first contact conductor; and determining a condition associated with the first contact conductor, based at least in part on the monitored first voltage potential.

20 Claims, 6 Drawing Sheets

SYSTEMS AND METHODS FOR DETERMINING ELECTRICAL GROUND FAULTS

RELATED APPLICATIONS

This application claims the benefit of non-provisional patent application Ser. No. 13/116,869 entitled "Systems and methods for determining electrical faults," filed May 26, 2011, the contents of which are incorporated herein by reference in its entirety, as if set forth in full.

FIELD OF THE INVENTION

This invention generally relates to detecting electrical faults, and in particular, to detecting fault conditions associated with contact or switch wiring.

BACKGROUND OF THE INVENTION

Remote switches are often used in industrial systems for determining a state or condition associated with machinery. The remote switches can be in an open or closed position, and the switch position can be communicated to control electronics, usually by long interconnecting cables, which typically contain a pair of wires for each switch. One problem associated with such remote switching and sensing systems is that the wiring associated with the interconnecting cables can become damaged, resulting in an open connection, or wires that are shorted to each other and/or to earth or chassis ground. If a wire to a remote switch is broken, the switch may appear to the control circuitry as being in an open position. If a pair of wires becomes shorted, the switch may appear to the control circuitry as being in a closed position. If a wire is shorted to ground, leakage current may mislead the sensing circuit. If the wires are damaged, the control system may receive a wrong signal, and a wrong decision may be made based on the wrong signal.

BRIEF SUMMARY OF THE INVENTION

Some or all of the above needs may be addressed by certain embodiments of the invention. Certain embodiments of the invention may include systems and methods for determining electrical faults.

According to an example embodiment of the invention, a method is provided for determining ground leakage electrical faults. The method includes providing a voltage source having a positive lead in communication with a first contact conductor and a negative lead in communication with a second field conductor, wherein the first contact conductor is connected to a ground through a first resistor Rp, and wherein the second field conductor is connected to the ground through a second resistor Rn; monitoring a first voltage potential associated with the first contact conductor; and determining a condition associated with the first contact conductor, based at least in part on the monitored first voltage potential.

According to another example embodiment, another method is provided for determining electrical faults. The method includes providing a voltage source having a positive lead in communication with a first contact conductor and a negative lead in communication with a second field conductor; providing a second contact conductor connected to the voltage source positive lead by a resistor Ry, and connected to the voltage source negative lead by resistor R1; receiving a power source reference; comparing, by voltage comparison circuitry, a field voltage value based on a field voltage that represents a voltage communicated from the second contact conductor to a generated reference voltage value, wherein the generated reference voltage value is based at least in part on the power source reference; generating a comparison value output based at least in part on the comparison of the field voltage value and the generated reference voltage; and determining one of a plurality of field conditions based at least in part on the comparison value output.

According to another example embodiment, a system is provided for determining electrical faults. The system includes a voltage source having a positive lead in communication with a first contact conductor and a negative lead in communication with a second field conductor, wherein the first contact conductor is connected to a ground through a first resistor Rp, and wherein the second field conductor is connected to the ground through a second resistor Rn. The system also includes a controller configured for monitoring a first voltage potential associated with the first contact conductor and further configured for determining a condition associated with the first contact conductor, based at least in part on the monitored first voltage potential.

Other embodiments and aspects of the invention are described in detail herein and are considered a part of the claimed invention. Other embodiments and aspects can be understood with reference to the following detailed description, accompanying drawings, and claims.

BRIEF DESCRIPTION OF THE FIGURES

Reference will now be made to the accompanying tables and drawings, which are not necessarily drawn to scale, and wherein.

DETAILED DESCRIPTION OF THE INVENTION

Embodiments of the invention will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Certain example embodiments of the invention may enable detection of open, shorted, and/or ground fault wire conditions associated with a remote switch.

According to certain example embodiments, detecting open wires within a contact input system may include using circuitry that can detect a broken signal wire within a ribbon cable between a terminal board and a control board, for example, and/or a broken wire between the terminal board and the field wired switch. Example embodiments of the invention may also be utilized to detect ground fault conditions.

Various resistors, comparison circuits, controllers, etc., may be utilized for detecting the electrical faults, according to example embodiments of the invention, and will now be described with reference to the accompanying figures.

Example embodiments of the invention include a system and method for sensing current flow and/or voltages associated with remote switches and the conductors that connect the switches to other parts of a system.

Figure 1:
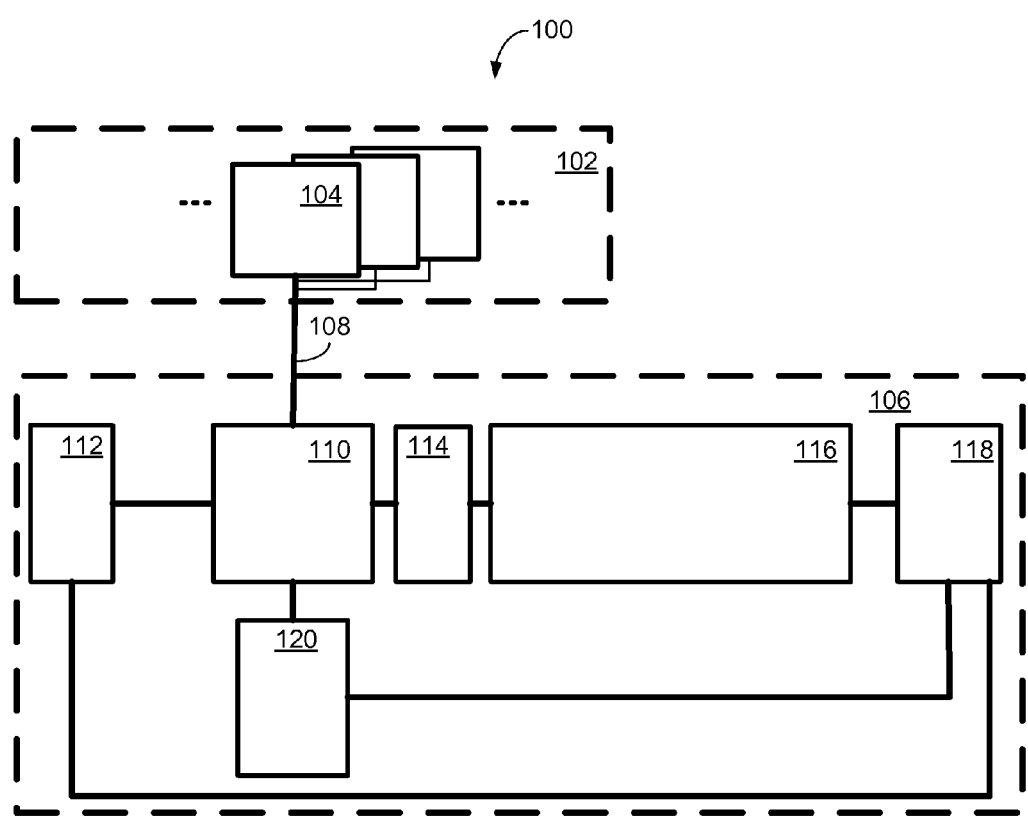
FIG. 1 is a block diagram of an illustrative electrical fault detection system according to an example embodiment of the invention.

FIG. 1 depicts an electrical fault detection system 100, according to an example embodiment of the invention. In an example embodiment, the system 100 may include a plant 102 with one or more associated switches and circuitry 104. For example, the plant 102 may include machinery or other devices that may interact with the switches and circuitry 104. In an example embodiment, the system 100 may also include a control system 106. In an example embodiment, the control system 106 may be located remotely from the switches and circuitry 104. According to an example embodiment, cables 108 may connect the switches and circuitry 104 to the control system 106.

According to an example embodiment of the invention, the control system 106 may include a terminal board 110 and associated circuitry, which may be used, at least in part, for connecting the cables 108 from the remote switches and circuitry 104 to the control system 106. The control system 106 may also include a battery or power supply 112 that may be in communication with the terminal board 110, and which may be utilized for providing a reference voltage for sensing the condition of the remote switches and circuitry 104. Example embodiments of the control system 106 may include internal interconnections 114, which may include, connectors, wires, ribbon cable, etc., for connecting to an acquisition circuit 116. According to an example embodiment, the acquisition circuit 116 may be in communication with a controller 118, which may include one or more microprocessors, programmable systems on a chip, etc. According to an example embodiment, the battery/power supply 112 may be in communication with the controller 118 and/or the acquisition circuit 116. In an example embodiment, the control system 106 may include ground leakage detection circuitry 120 in communication with the terminal board 110 and the controller 118.

Figure 2:
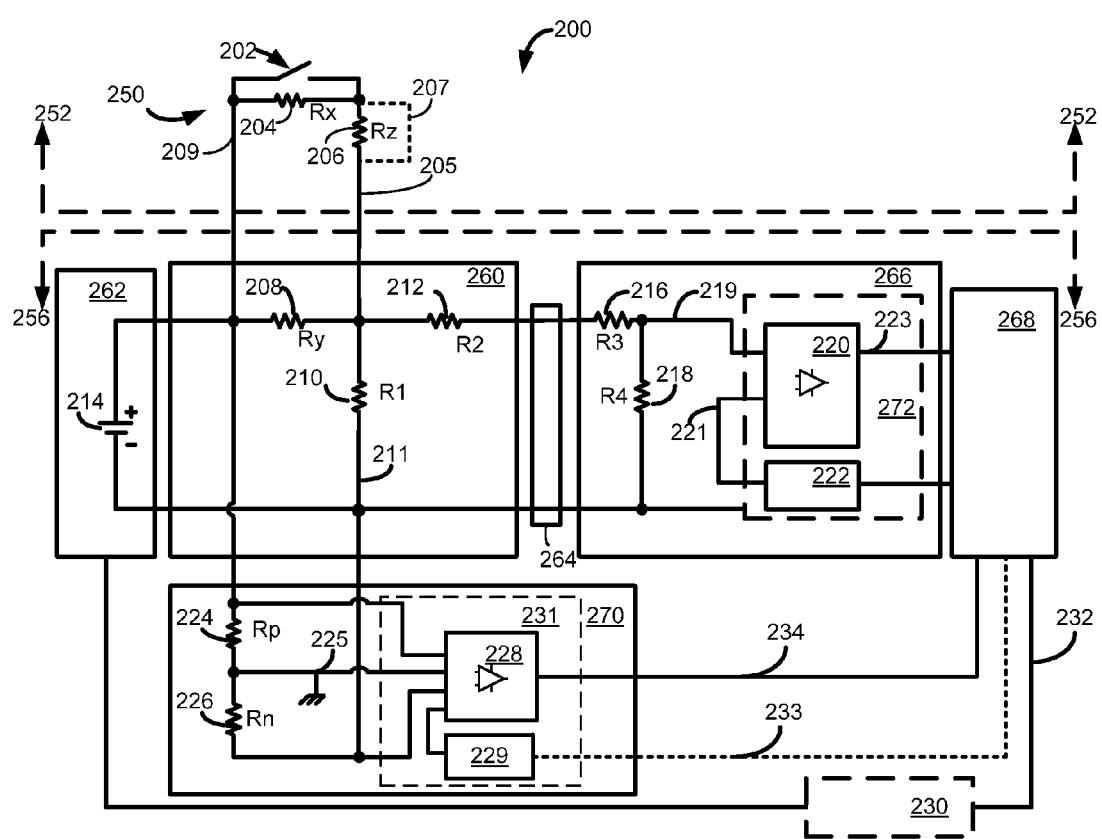
FIG. 2 is a schematic diagram of an illustrative fault detection circuit and system according to an example embodiment of the invention.

FIG. 2 is a schematic drawing of an example fault detection circuit 200, in which certain blocks may correspond to respective blocks of FIG. 1. The example fault detection circuit 200 may be utilized for detecting ground faults, open conductors, shorted conductors, or other conditions associated with cables or wires that connect to remote switches. According to an example embodiment, the fault detection circuit 200 may include one or more switches and associated circuitry 250. The fault detection circuit 200 may include a switch 202. In an example embodiment, a resistor Rx 204 may be placed in a parallel connection with the switch 202 so that a small amount of current may flow through the resistor Rx 204 when the switch 202 is open. According to an example embodiment, a resistor Rz 206 may be placed in series with the switch 202, primarily for detecting when the switch 202 is closed and for providing a small voltage drop which may be used to distinguish between a shorted cable and the closed switch 202. According to an example embodiment, resistor Rz 206 may be bypassed or replaced with an optional short circuit 207.

According to an example embodiment, the switch 202, associated with parallel resistor Rx 204, and series resistor Rz 206 may be located remotely from the control system 256, and may be connected to a terminal board circuit 260 by one or more cables. For example, the cable connecting the switch to the terminal board circuit 260 may include two or more insulated conductors. In an example embodiment, the cable may include a first contact conductor 209 that may provide a connection between the junction of the terminal board circuit 260, the positive lead of a power supply 262, and the switch 202. According to another example embodiment, a second contact conductor 205 may provide a connection from the switch 202 (or from Rz 206) to the terminal board circuit 260. In an example embodiment, the terminal board circuit 260 may include a resistor Ry 208 in parallel with the switch 202. In an example embodiment, the terminal board circuit 260 may also include a series branch resistor R1 210 in series with series resistor Rz 206 and leading to a circuit negative lead connection 211. In an example embodiment, the terminal board circuit 260 may also include a series branch resistor R2 212 in series with series resistor Rz 206, but leading to an acquisition board circuit 266.

According to an example embodiment, one lead (for example, a positive lead) of a power supply 262 or battery 214 may be connected with the terminal board circuit 260, the resistor Ry 208, the parallel resistor Rx 204, and the switch 202. In an example embodiment, another lead of the power supply 262 (for example, the negative lead) of the power supply 262 may be connected to the circuit negative lead connection 211. In an example embodiment, the terminal board circuit 260 may be in communication with an acquisition board circuit 266 via an internal interconnection 264, such as a ribbon cable.

According to an example embodiment of the invention, the acquisition board circuit 266 may include a series resistor R3 216 in series communication with resistor R2 212 of the terminal board circuit 260. In an example embodiment, a resistor R4 218 may form a series circuit with resistor R3 216 and the circuit negative lead connection 211. In an example embodiment, a voltage divider network may be established with the combination of resistor R4 218 and R3 216, so that a sensing input voltage 219 may be present on an input of a comparator 220. According to an example embodiment, a digital-to-analog converter (DAC) 222 may receive a signal from a controller 268 (for example, a PWM signal or other digital signal), and the DAC 222 may provide an analog input 221 on the comparator 220 for comparing with the sensing input voltage 219. In an example embodiment, the signal output 223 of the comparator 220 may be provided to the controller 268 for evaluation. In another example embodiment, the controller 268 may include its own internal circuitry for providing an analog input 221 to the comparator 220, eliminating the need for the DAC 222. Yet in another example embodiment, the controller 268 may include all of the necessary circuitry required for evaluating the sensing input voltage 219, for determining its value relative to reference values, and for evaluating the condition of the various connections and cables associated with the switch 202. In this example embodiment, the external comparator 220 and the DAC 222 may be eliminated or bypassed (as indicated by the dashed box surrounding the comparator 220 and the DAC 222), and the controller 268 may directly process the sensing input voltage 219.

According to an example embodiment, the power supply 262 circuit may also be in communication with the controller 268, for establishing a baseline reference value 232 for which the controller 268 may evaluate sensing input voltages 219 or comparator signal output 223. For example, since the various voltages associated with the switch 202, associated circuitry 250, cables, and various resistors 208, 210, 212, 216, 218 are ultimately derived from the voltage of the battery 214 or power supply 262, the comparison voltage levels produced or read by the controller 268 may be based on the voltage of the battery 214 or power supply 262, so that as the battery 214 or power supply 262 voltage fluctuates, the comparison voltage levels can scale accordingly.

In an example embodiment, an optional power supply voltage interface circuit 230 may be utilized between the power supply 262 and the controller 268. In an example embodiment, the optional power supply voltage interface circuit 230 may include an analog-to-digital converter operable for sensing the analog voltage of the power supply 262, and presenting a digital signal 232 for the controller 268. However, as indicated above, if the controller 268 includes the requisite on-board circuitry for analog input, the optional power supply voltage interface circuit 230 may not be required (as indicated by the dashed box surrounding the power supply voltage interface circuit 230).

According to an example embodiment of the invention, the fault detection circuit 200 may include a ground leakage detection circuit 270 that may be utilized to detect when one or more switch 202 conductors, for example, the first contact conductor 209 and/or the second contact conductor 205, come into contact with earth ground or chassis ground. In an example embodiment, the ground leakage detection circuit 270 is in communication with the first contact conductor 209, which may be tied to the positive lead of the power supply 262, and may be in communication with the switch 202. In an example embodiment, the first contact conductor 209 may be connected to one end of a resistor Rp 224. In an example embodiment, the other end of the resistor Rp 224 may be connected to earth and/or chassis ground 225. In an example embodiment, the first contact conductor 209 may also be connected to a positive input of a leakage comparator circuit 228, which according to an example embodiment, may include an analog-to-digital converter. In an example embodiment, the leakage comparator circuit 228 may include an operational amplifier that may provide an output proportional to a differential voltage on the inputs.

According to an example embodiment, the ground leakage detection circuit 270 may include a resistor Rn 226 tied to earth and/or chassis ground on one end, and to the circuit negative lead connection 211 on the other end. According to an example embodiment, the second contact conductor 205 may be tied to the negative lead of the power supply 214. According to an example embodiment, the circuit negative lead connection 211 may also be tied to a negative input of the leakage comparator circuit 228. According to an example embodiment, the ground leakage detection circuit 270 may provide an output signal 234 representative of a differential voltage presented on the inputs (209, 211) to the leakage comparator circuit 228. For example, in a normal operation of the circuit, where no switch wires (209, 205, 211) are shorted to earth or chassis ground, the differential voltage presented on the inputs (209, 211) of the leakage comparator circuit 228 may be approximately equal to the power supply 262 voltage. If, however, a portion of the circuit in communication with the first contact conductor 209 comes into contact with ground or develops leakage to ground, the voltage on the first contact conductor 209 may drop to the approximate ground potential. According to an example embodiment, if the second contact conductor 205 is not in contact with earth or chassis ground, the result may be that the power supply 262 will be referenced at earth or chassis ground 225 on the positive lead or the first contact conductor 209, the circuit negative lead connection 211 will now be pushed below ground voltage, and the current may flow from chassis or earth ground 225 through resistor Rn 226, creating a net negative voltage with respect to chassis or earth ground 225 on the circuit negative lead connection 211. In accordance with an example embodiment, this condition may present a negative differential voltage across the inputs of the leakage comparator circuit 228, and hence, the ground leakage signal 234 may be indicative of the grounded first contact conductor 209.

According to an example embodiment, the ground leakage detection circuit 270 may include a leakage comparator circuit 228 and digital-to-analog converter 229. In an example embodiment, the chassis or earth ground 225 may be tied to the leakage comparator circuit 228 for a reference. In an example embodiment, a microprocessor or controller 268 may provide any number of reference output signals 233 for ground leakage comparison with the ground leakage detection circuit output 234. According to an example embodiment, the ground leakage detection circuit output 234 may be representative or proportional to the voltage present of the differential inputs of the leakage comparator circuit 228, or the ground leakage detection circuit output 234 may be a digital high or low signal that may indicate whether the signal input to the leakage comparator circuit 228 from the digital-to-analog converter 229 (and derived from digital reference output 233 from the controller 268) is higher or lower than any of the other inputs on the leakage comparator circuit 228.

According to another example embodiment, the circuit negative lead connection 211 may come into contact with earth or chassis ground 225 or conduct leakage current to ground, and in this case, any difference in potential between the normal (ungrounded) circuit negative lead connection 211 (i.e., negative power supply potential) and a grounded circuit negative lead connection 211 may be detectable by virtue of leakage current flowing (or not flowing) through resistor Rn 226, and such current may alter the potential presented on the negative input of the leakage comparator circuit 228.

According to an example embodiment, if both the first contact conductor 209 and the circuit negative lead connection 211 come into contact (or conduct leakage current) with earth or chassis ground 225, or with each other (independent of ground), the differential voltage presented to the inputs of the leakage comparator circuit 228 may be about zero. Therefore, according to example embodiments of the invention, the ground leakage detection circuit 270 may be able to distinguish between at least three ground fault conditions including, but not limited to, (1) first contact conductor 209 shorted or conducting leakage current to chassis or earth ground 225; (2) circuit negative lead connection 211 shorted or conducting leakage current to chassis or earth ground 225; and/or (3) both the first contact conductor 209 and the circuit negative lead connection 211 shorted or conducting leakage current to chassis or earth ground 225 or to each other.

According to an example embodiment of the invention, the leakage comparator circuit 228 may include an optional analog-to-digital converter for converting the ground leakage signal 234 to a digital format for reading by the controller 268. In another example embodiment, the leakage comparator circuit 228 may include analog components, and the ground leakage signal 234 may be analog if the controller 268 includes the requisite components for interfacing and converting analog signals for processing or reading by the controller 268 or the controller's microprocessor.

Returning now to the overall fault detection circuit 200, in an example embodiment, different relative voltage levels presented at the sensing input voltage 219 may indicate a corresponding condition associated with the various wiring associated with the switch 202. For example, and depending on the choice of values selected for the various resistors (204, 206, 208, 210, 212, 216, 218), a value of approximately 60% of the full power supply 262 voltage may indicate that the sensing contact is open or closed. In another example embodiment, a value of approximately 10% of the full power supply 262 voltage may indicate that an internal interconnection 114 or cable wire has opened between the terminal board circuit 260 and the acquisition board circuit 266. In another example embodiment, a voltage value of approximately 20% of the full power supply 262 may indicate that wiring to the switch 202 has opened (where resistor Rx 204 is installed at the switch). According to example embodiments, the various resistors (204, 206, 208, 210, 212, 216, 218) may act to change the input circuit such that the contact controlled voltages have multiple values (typical values are shown in percentages since the threshold may be in proportion to the battery 214 or power supply 262 voltage). For example, the power supply reference 232 may provide the reference for comparison with the sensing input voltage 219. For example, when the sensing input voltage 219 is approximately the full power supply 262 voltage (approximately 100%), such a condition may represent a closed switch 202. In an example embodiment, when the sensing input voltage 219 is approximately 24% to 28% of the power supply 262 voltage, it may be indicative of an open switch 202 with the parallel resistor Rx 204 installed. In an example embodiment, when the sensing input voltage 219 is approximately 13% to approximately 17% of the full power supply 262 voltage, such a condition may represent an open wire to the contact or for an open switch 202 that does not include a parallel resistor Rx 204. In an example embodiment, when the sensing input voltage 219 is approximately 0% of the full power supply 262 voltage, such a condition may represent an internal interconnection cable 264 wire open between the terminal board circuit 260 and the acquisition board circuit 266.

According to example embodiments of the invention, several situations may occur for sensing an open wire, or a ground fault. In the first situation, and according to an example embodiment, sensing resistors Rx 204 and Ry 208 are present, and resistor Rz 206 may be present or bypassed, and the switch 202 is open or closed with a ground fault existing on the first contact conductor 209. In this situation, the ground leakage detection circuit 270 (and in particular, the optional comparator and digital-to-analog converter 231) may detect the ground fault on the first contact conductor 209 based on a difference in voltage across resistors Rp 224 and Rn 226.

In a second situation, and according to an example embodiment, sensing resistors Rx 204 and Ry 208 are present, resistor Rz 206 may be present or bypassed, and the switch 202 is open or closed with a ground fault existing on the second contact conductor 205. In this situation, the acquisition board circuit 266 (and in particular, the optional comparator and digital-to-analog converter 272) may detect the ground fault on second contact conductor 205 based on a compared value that may correspond to such a field condition.

In a third situation, and according to an example embodiment, sensing resistors Rx 204 and Ry 208 may be unconnected or open, resistor Rz 206 may be present or bypassed, and the switch 202 is open or closed with a ground fault existing on the first contact conductor 209. In this situation, the ground leakage detection circuit 270 (and in particular, the optional comparator and digital-to-analog converter 231) may detect the ground fault on the first contact conductor 209 based on a difference in voltage across resistors Rp 224 and Rn 226.

In a fourth situation, and according to an example embodiment, sensing resistors Rx 204 and Ry 208 may be unconnected or open, resistor Rz 206 may be bypassed, and the switch 202 is closed with a ground fault existing on the second contact conductor 205. In this situation, the ground leakage detection circuit 270 (and in particular, the optional comparator and digital-to-analog converter 231) may detect the ground fault on second contact conductor 205 based on a difference in voltage across resistors Rp 224 and Rn 226.

In a fifth situation, and according to an example embodiment, sensing resistors Rx 204 and Ry 208 may be unconnected or open, resistor Rz 206 may be present or bypassed, and the switch 202 is open with a ground fault existing on the second contact conductor 205. In this situation, the acquisition board circuit 266 (and in particular, the optional comparator and digital-to-analog converter 272) may detect the ground fault on second contact conductor 205 based on a compared value that may correspond to such a field condition.

In an example embodiment, the choice for the resistor values may be governed by current draw. For example, according to an embodiment, the values for the parallel resistors Rx 204 and Ry 208 may be set high enough to not make the open sensed voltage too high and to limit the current drawn through resistors Rx 204 and Ry 208. For example, if the resistance is too high, the open voltage for proper connection may not be very different from the open wire cases, making the detection threshold difficult to maintain. According to an example embodiment of the invention, the resistors Rx 204 and Ry 208 may be set at approximately 750K ohms. Other example embodiments include setting any of the resistance values anywhere from about 1K to about 1M ohm without departure from the scope of the invention.

According to example embodiments of the invention, the controller 268 may provide a series of comparison voltages to the reference voltage value input 221 for comparison via the DAC 222 with the sensing input voltage 219. In an example embodiment, the comparison voltages to the reference voltage value input 221 may be converted with a DAC 222. In another example embodiment, the controller 268 may be able to provide this as an analog signal. In an example embodiment, and based on the reference voltage value input 221, the comparator may be utilized to determine the relationship of the sensing input voltage 219 compared to different reference voltages. For example, the controller 268 may start by generating a first reference for presentation to the comparator 220 via the reference voltage value input 221. The comparison value output 223 may be evaluated as either being high or low, and the value may be recorded. Then, the controller 268 may generate a second reference (and so forth) for presentation to the comparator 220 via the reference voltage value input 221, and again, the comparison value output 223 may be evaluated as either being high or low and the value may be recorded. According to an example embodiment, the process may be repeated (for example, four times), and different references and field conditions may be evaluated. For example, if the sequence of comparison value outputs 223 are "Low-Low-Low-Low," then it may be indicative of wire fault (open) between the terminal board circuit 260 and the acquisition board circuit 266. According to an example embodiment, if the sequence of comparison value outputs 223 are "High-High-High-High," then it may be indicative of a closed switch 202, under normal operation. Such a sequence of four reference voltage value inputs 221 may be produced to evaluate five faults. In an example embodiment, an evaluation of three fault types may require a sequence of two reference voltage value inputs 221.

According to an example embodiment, multiple switches 202 and multiple associated field wires (209, 211) associated with the multiple switches 202 may be evaluated using circuits similar to those presented above, and in FIGS. 1 and 2, but with the addition of optional multiplexers. For example, such multiplexers may be inserted before the comparator 220. In an example embodiment, multiple inputs (for example, multiple sensing input voltages 219) may be used as inputs to a multiplexer. In an example embodiment, the output of the multiplexer may provide input to the comparator 220. In an example embodiment, the switching sequence and timing of the multiplexer may be controlled by the controller 268.

In accordance with example embodiments of the invention, ground faults at the input circuits 250 may include a fault at the input side at the first contact conductor 209, which is equivalent to a ground fault at the positive side of battery 214. This fault may be directly detected by the ground leakage detection circuit 270. In accordance with example embodiments of the invention, ground faults at the input circuits 250 may include a fault at the output side of the switch circuitry 250 on the second contact conductor 205. Such a fault may divert an increment of relatively small current that no longer would flow through the two balance resistors Rp 224 and Rn 226, and specifically, where the ground fault effectively adds a parallel resistance across Rp 224. This small amount of potential ground fault current within each input circuit 250 would be limited by the resistors Rx 204, Ry 206, and Rx 208 to an amount that is within safety guidelines.

According to an example embodiment, if the short circuit 207 is installed and if the switch 202 is closed, this condition may result in the worst case of a direct connection to ground from the battery 214's positive side such that only one ground fault is sufficient to cause detection due to the voltage across Rp 224 being outside its threshold range as set by the digital-to-analog converter 229 via the controller 268. However, if the short circuit 207 is not installed, then the parallel resistance is a combination of either resistor Rx 204 in series with resistor Rz 206 both in parallel with resistor Ry 208 when the switch 202 is open, or a parallel of resistor Rz 208 and Ry 206 when the switch is closed. Since this parallel resistance is typically made up of components in the 100K ohm and up range, in parallel with resistor Rp 224 which is usually in the 10K to 100K ohm range, a single ground fault may only divert enough current to cause a relatively small change in the voltage across resistor Rp 224 compared to the voltage across resistor Rn 226. If this relatively smaller amount of voltage change is due to the individual ground fault at the second contact conductor 205, diverting current may not be large enough to pass a threshold (as set by the digital-to-analog convertor 229 via the controller 268) to cause the leakage comparator circuit 228 to change state, and an individual ground fault at the second contact conductor 205 could be missed. However, such a fault may still fall within the safety guidelines, which are typically concerned with the amount of current that is passed to ground via the overall ground faults. For example, in this case the current may still be limited to within safety guidelines by the parallel combination of resistances in the individual switch input circuit. According to an example embodiment, as other input circuits have ground faults that occur at their input wiring second contact conductor 205, additional current paths to ground may cause additional shifts in voltage across resistor Rp 224 with respect to the voltage across resistor Rn 226 with the detection by the leakage comparator circuit 228 and the controller 268.

Figure 3:
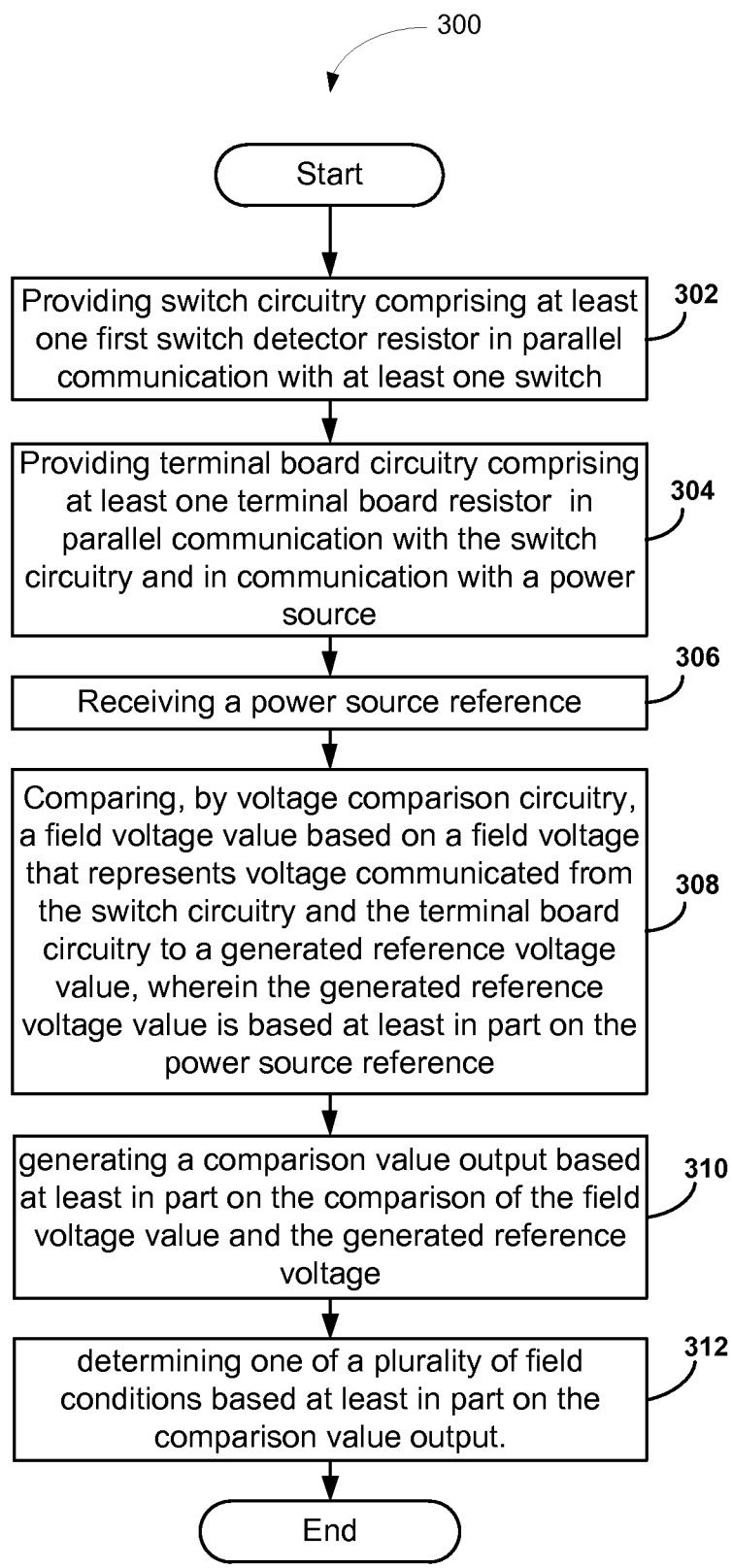
FIG. 3 is a flow diagram of an example method according to an example embodiment of the invention.

An example method 300 for determining electrical faults will now be described with reference to the flow diagram of FIG. 3. The method 300 starts in block 302, and according to an example embodiment, includes providing switch circuitry comprising at least one first switch detector resistor in parallel communication with at least one switch.

In block 304, and according to an example embodiment, the method 300 includes providing terminal board circuitry comprising at least one terminal board resistor in parallel communication with the switch circuitry and in communication with a power source. In block 306, and according to an example embodiment, the method 300 includes receiving a power source reference. In block 308, and according to an example embodiment, the method 300 includes comparing, by voltage comparison circuitry, a field voltage value based on a field voltage that represents voltage communicated from the switch circuitry and the terminal board circuitry to a generated reference voltage value, wherein the generated reference voltage value is based at least in part on the power source reference. In block 310, and according to an example embodiment, the method 300 includes generating a comparison value output based at least in part on the comparison of the field voltage value and the generated reference voltage. In block 312, and according to an example embodiment, the method 300 includes determining one of a plurality of field conditions based at least in part on the comparison value output. The method 300 ends after block 312.

Figure 4:
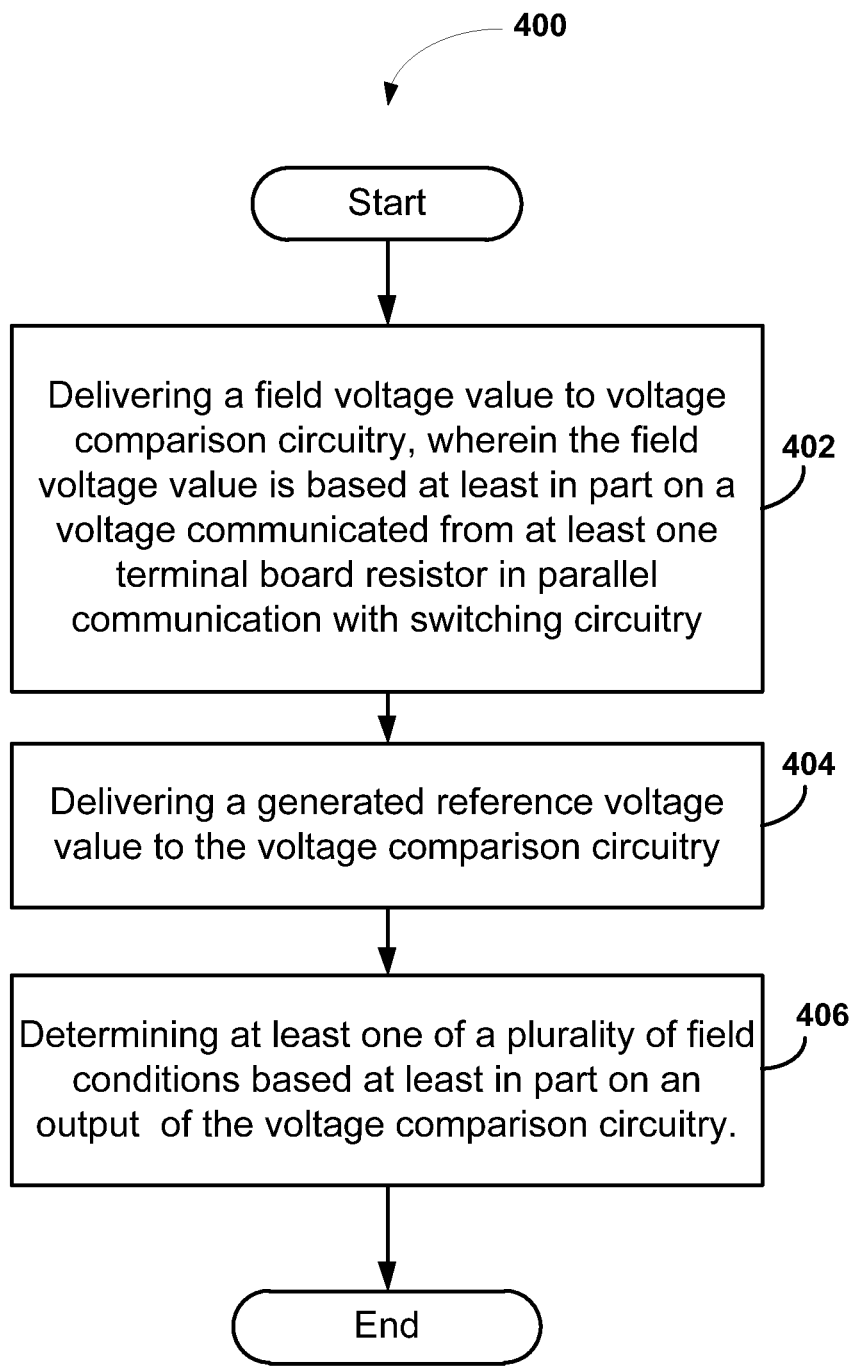
FIG. 4 is a flow diagram of another example method according to an example embodiment of the invention.

An example method 400 for determining ground leakage electrical faults will now be described with reference to the flow diagram of FIG. 4. The method 400 starts in block 402, and according to an example embodiment, includes delivering a field voltage value to voltage comparison circuitry, wherein the field voltage value is based at least in part on a voltage communicated from at least one terminal board resistor in parallel communication with switching circuitry. In block 404, and according to an example embodiment, the method 400 includes delivering a generated reference voltage value to the voltage comparison circuitry. In block 406, and according to an example embodiment, the method 400 includes determining at least one of a plurality of field conditions based at least in part on an output of the voltage comparison circuitry. The method 400 ends after block 406.

Figure 5:
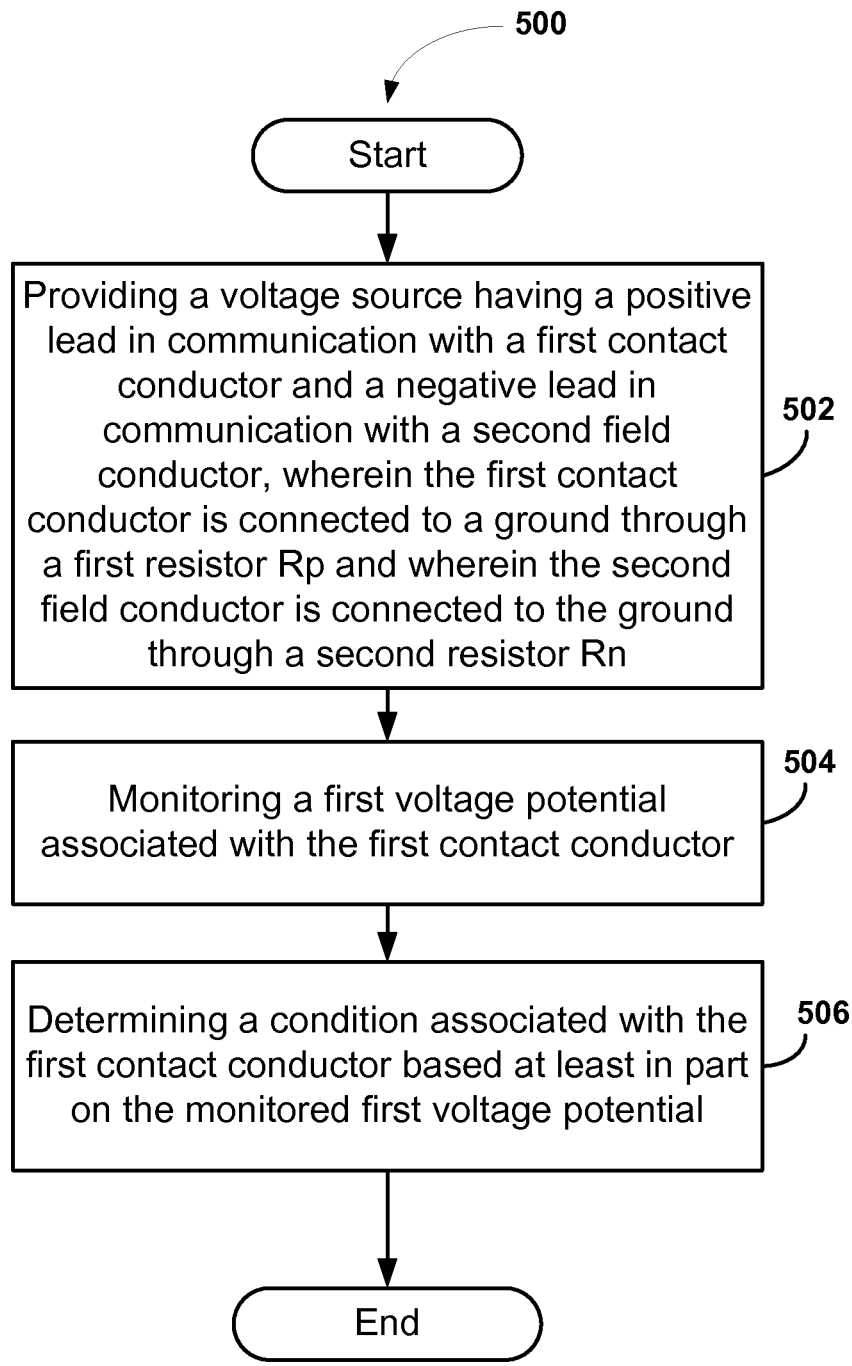
FIG. 5 is a flow diagram of another example method according to an example embodiment of the invention.

An example method 500 for determining ground leakage electrical faults will now be described with reference to the flow diagram of FIG. 5. The method 500 starts in block 502, and according to an example embodiment, includes providing a voltage source having a positive lead in communication with a first contact conductor and a negative lead in communication with a second field conductor, wherein the first contact conductor is connected to a ground through a first resistor Rp and wherein the second field conductor is connected to the ground through a second resistor Rn. In block 504, and according to an example embodiment, the method 500 includes monitoring a first voltage potential associated with the first contact conductor. In block 506, and according to an example embodiment, the method 500 includes determining a condition associated with the first contact conductor based at least in part on the monitored first voltage potential. The method 500 ends after block 506.

Figure 6:
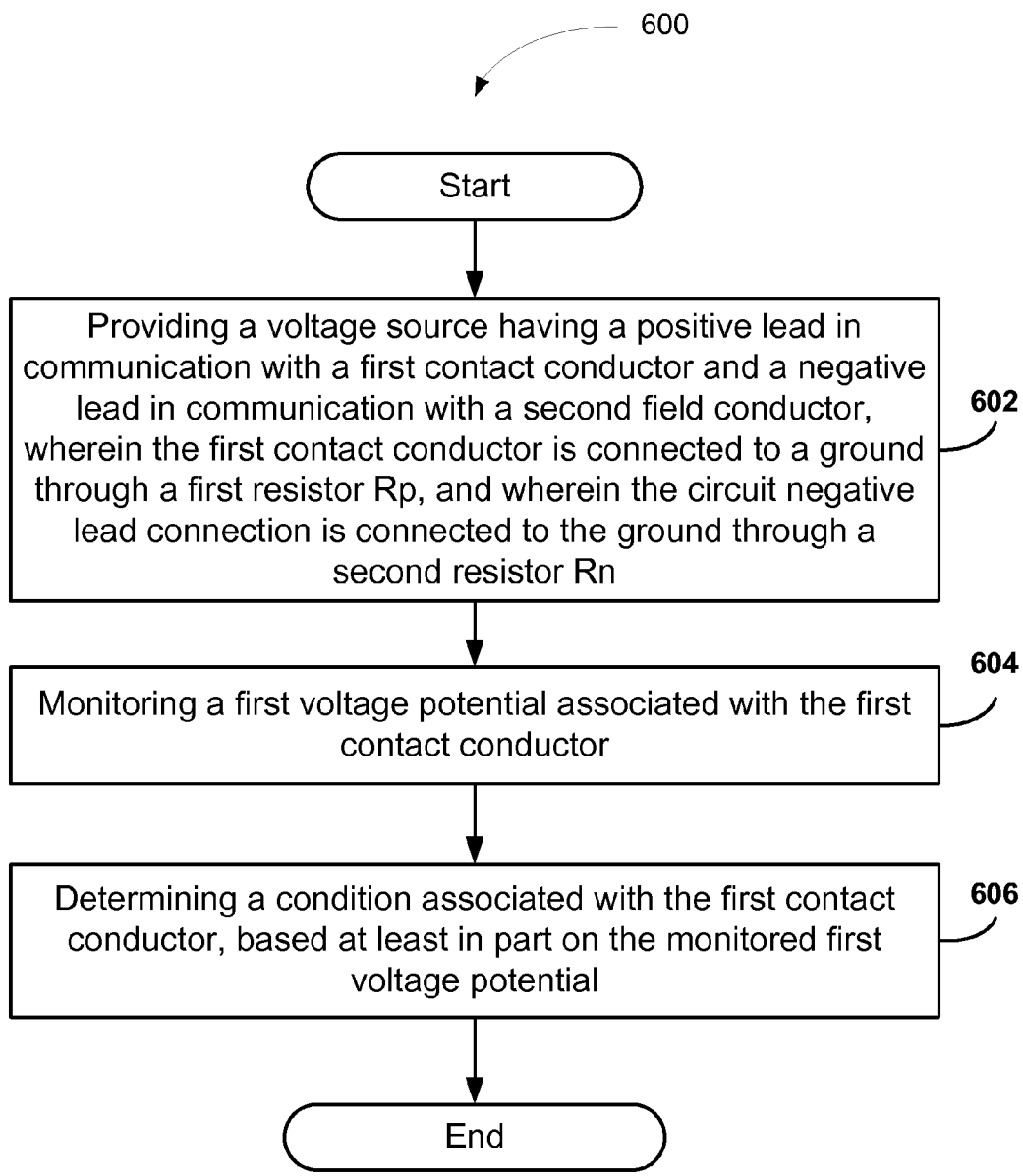
FIG. 6 is a flow diagram of another example method according to an example embodiment of the invention

An example method 600 for determining ground leakage electrical faults will now be described with reference to the flow diagram of FIG. 6. The method 600 starts in block 602, and according to an example embodiment, includes providing a voltage source having a positive lead in communication with a first contact conductor and a negative lead in communication with a circuit negative lead connection, wherein the first contact conductor is connected to a ground through a first resistor Rp, and wherein the circuit negative lead connection is connected to the ground through a second resistor Rn. In block 604, and according to an example embodiment, the method 600 includes monitoring a first voltage potential associated with the first contact conductor. In block 606, and according to an example embodiment, the method 600 includes determining a condition associated with the first contact conductor, based at least in part on the monitored first voltage potential. The method 600 ends after block 606.

Example embodiments of the invention include determining one of the plurality of field conditions, where the determining is performed at least in part by a controller (118) comprising instructions and in communication with the voltage comparison circuitry (220). Example embodiments of the invention include switch circuitry (250), where the switch circuitry (250) further includes at least one second switch detector resistor (206) in series communication with the at least one switch (202).

Example embodiments of the invention include providing ground leakage detector circuitry (120) comprising leakage detection circuitry (228) in communication with the terminal board circuitry (110) and the controller (118), wherein the ground leakage detection circuitry (120) is in communication with the power source (112) and a first field conductor (209), and wherein the ground leakage detection circuitry (120) comprises a resistor network comprising at least a first divider resistor (224) and a second divider resistor (226) in series communication with a circuit negative lead connection (211) and having a ground connected between the first divider resistor (224) and the second divider resistor (226); generating one or more voltages with the ground leakage detector circuitry (120) wherein the one or more voltages respectively correspond to one or more conditions of: normal operation, a grounded first field conductor (209), or a grounded circuit negative lead connection (211); and determining the one or more conditions, based at least on the one or more voltages generated by the ground leakage detector circuitry (120). Example embodiments include determining a plurality of field conditions, wherein the plurality of field conditions comprises one or more of: (a) a wire open condition; (b) a switch open condition; (c) a switch closed condition; (d) a wire to wire short condition; (e) a grounded wire condition; (f) a wire fault between the terminal board circuitry and the acquisition board circuitry; or (g) a normal condition. Example embodiments include switching circuitry (202) wherein the switching circuitry (202) is operable to generate field voltage values (219) in response to each of the plurality of field conditions, which when compared by the voltage comparison circuitry (220) of the acquisition board circuitry (116) with respect to the generated reference voltage value (221) will generate an output (223) which can be utilized by the controller to determine the field conditions.

Example embodiments of the invention include switching circuitry (250) wherein the switching circuitry (250) further includes at least one-second switch detector resistor (206) in series communication with at least one switch (202), wherein the at least one second switch detector resistor (206) facilitates determining a field wire fault occurring between the at least one switch (202) and the at least one terminal board resistor (208). Example embodiments include receiving plurality of field voltage values (219) at the voltage comparison circuitry (220), wherein each of the plurality of the field voltage values (219) is based at least in part on a voltage communicated from at least one of a plurality of terminal board resistors (208) in parallel communication with a corresponding plurality of switches (202); and determining at least one of a plurality of field conditions associated with the plurality of switches (202) based at least in part on the plurality of the field voltage values (219) and the generated reference voltage value (221), wherein the generated reference voltage value (221) is based at least in part on a power supply reference (232).

Example embodiments of the invention include a system for determining electrical faults. The system includes switch circuitry (104) comprising at least one first switch detector resistor (204) in parallel communication with at least one switch (202); terminal board circuitry (110) comprising at least one terminal board resistor (208) in parallel communication with the switch circuitry (104) and in communication with a power source (112); acquisition board circuitry (116) comprising voltage comparison circuitry (220) operable to receive a generated reference voltage value (221) as a first input and a field voltage value (219) as a second input and to output a comparison value (223), wherein the field voltage value (219) represents voltage communicated from the switch circuitry (104) and the terminal board circuitry (110); and a controller (118) comprising at least one processor and instructions, wherein the controller is adapted to: receive a power source reference (232); control the generated reference voltage value (221) to the voltage comparison circuitry (220) based at least in part on the power source reference (232); receive the comparison value output (223) from the voltage comparison circuitry (220); and determine one of a plurality of field conditions based at least in part on the comparison value (223).

Example embodiments of the switch circuitry (250) further comprises at least one second switch detector resistor (206) in series communication with the at least one switch (202). Example embodiments further include ground leakage detector circuitry (120) including a resistor divider circuit operable to generate a voltage and in series communication with the power source (112) and a first field conductor (209), wherein the resistor divider circuit comprises at least a first divider resistor (224) and a second divider resistor (226) in series communication with a circuit negative lead connection (211) and having a ground connected between the first divider resistor (224) and the second divider resistor (226). In example embodiments, the ground leakage detector circuitry (120) further includes leakage detection circuitry (228) in communication with the terminal board circuitry (110) and the controller (118), wherein the leakage detection circuitry (228) is operable to compare a voltage (209) associated with the switch circuitry (104) and one or more voltages associated with a ground (225). Example embodiments of the invention include the system wherein voltage generated across the ground leakage detector circuitry (120) corresponds to one or more of: normal operation, a grounded first field conductor (209); or a grounded circuit negative lead connection (211). Example embodiments of the system include a system wherein voltage generated across the ground leakage detector circuitry (120) corresponds to connectivity of one or more of: the first switch detector resistor (204), the second switch detector resistor (206), the first divider resistor (224), the second divider resistor (226), the first field conductor (209), or the circuit negative lead connection (211). Example embodiments of the system include acquisition board circuitry (116) including one or more of an analog-to-digital converter device or a digital-to-analog converter device. According to an example embodiment of the invention, the plurality of field conditions may include one or more of: (a) a wire open condition; (b) a switch open condition; (c) a switch closed condition; (d) a wire to wire short condition; (e) a grounded wire condition; (f) a wire fault between the terminal board circuitry and the acquisition board circuitry; or (g) normal operation. In an example embodiment, the switch circuitry (202) is operable to generate field voltage values (219) in response to each of the plurality of respective field conditions, which when compared by the voltage comparison circuitry (220) of the acquisition board circuitry (116) with respect to the generated reference voltage value (221) will generate an output (223) which can be utilized by the controller to determine the field conditions. In an example embodiment, the output (223) associated with a respective one of the plurality of field conditions represents a relative comparison of the field voltage value (219) to the generated reference voltage value (221), wherein the generated reference voltage value (221) is based at least in part on the power supply reference (232). In an example embodiment, the output (223) associated with a respective one of the plurality of field conditions represents a percentage of the generated reference voltage value (221) indicated by the respective field voltage value (219).

According to an example embodiment of the invention, a method is provided for determining ground leakage electrical faults. The method includes providing a voltage source having a positive lead in communication with a first contact conductor and a negative lead in communication with a second field conductor, wherein the first contact conductor is connected to a ground through a first resistor Rp, and wherein the second field conductor is connected to the ground through a second resistor Rn; monitoring a first voltage potential associated with the first contact conductor; and determining a condition associated with the first contact conductor, based at least in part on the monitored first voltage potential. In an example embodiment, determining a condition associated with the first contact conductor (209) is further based on determining a voltage associated with the voltage source (262), wherein the condition comprises determining if the first contact conductor (209) is connected to a ground (225). Example embodiments of the method may include monitoring a second voltage potential associated with the circuit negative lead connection (211); monitoring a voltage associated with the voltage source (262); and determining a condition associated with the circuit negative lead connection (211), based at least in part on the monitored second voltage potential and the monitored voltage associated with the voltage source (262). In an example embodiment, determining a condition associated with circuit negative lead connection (211) includes determining if the circuit negative lead connection (211) is connected to a ground (225). According to an example embodiment, a first voltage potential associated with the first contact conductor (209) is monitored with respect to the ground (225). In an example embodiment, a second voltage potential associated with the circuit negative lead connection (211) is monitored with respect to the ground (225). According to example embodiments of the invention, the voltage source (262) comprises a battery (214).

Example embodiments of the invention include a method for determining ground leakage electrical faults. The method includes providing a voltage source (262) having a positive lead in communication with a first contact conductor (209) and a negative lead in communication with a circuit negative lead connection (211); providing a second contact conductor (205) connected to the voltage source (262) positive lead by a resistor Ry (208), and connected to the voltage source (262) negative lead by resistor R1 (210); receiving a power source reference (232); comparing, by voltage comparison circuitry (220), a field voltage value (219) based on a field voltage that represents a voltage communicated from second contact conductor (205) to a generated reference voltage value (221), wherein the generated reference voltage value is based at least in part on the power source reference (232); generating a comparison value output (223) based at least in part on the comparison of the field voltage value (219) and the generated reference voltage (221); and determining one of a plurality of field conditions based at least in part on the comparison value output (223).

In an example embodiment, the at least one of the plurality of field conditions comprises a second contact conductor (205) connected to a ground. In an example embodiment, receiving a power source reference (232) is based on a battery (214) voltage.

According to an example embodiment of the invention a system is provided for determining ground leakage electrical faults. The system can include a voltage source (262) having a positive lead in communication with a first contact conductor (209) and a negative lead in communication with a circuit negative lead connection (211), wherein the first contact conductor (209) is connected to a ground (225) through a first resistor Rp (224), and wherein the circuit negative lead connection (211) is connected to the ground (225) through a second resistor Rn (226); and a controller (268) configured for monitoring a first voltage potential associated with the first contact conductor (209) and further configured for determining a condition associated with the first contact conductor (209), based at least in part on the monitored first voltage potential. According to an example embodiment, determining a condition associated with the first contact conductor (209) is further based on determining a voltage associated with the power supply (262), wherein the condition comprises determining if the first contact conductor (209) is connected to a ground (225).

In an example embodiment, the system may monitor a second voltage potential associated with the circuit negative lead connection (211); monitor a voltage associated with the power supply (262); and determine a condition associated with the circuit negative lead connection (211), based at least in part on the monitored second voltage potential and the monitored voltage associated with the power supply (262). According to an example embodiment, the controller (268) may further be configured for determining if the circuit negative lead connection (211) is connected to a ground (225). In an example embodiment, the first voltage potential associated with the first contact conductor (209) is monitored with respect to the ground (225). In an example embodiment, the second voltage potential associated with the circuit negative lead connection (211) is monitored with respect to the ground (225). According to an example embodiment, the voltage source (262) may include a battery (214).

In an example embodiment, a second contact conductor (205) is connected to the voltage source (262) positive lead by a resistor Ry (208), and connected to the voltage source (262) negative lead by resistor R1 (210). According to an example embodiment, the controller (268) is further configured for receiving a power source reference (232); comparing, by voltage comparison circuitry (220), a field voltage value (219) based on a field voltage that represents a voltage communicated from second contact conductor (205) to a generated reference voltage value (221), wherein the generated reference voltage value is based at least in part on the power source reference (232); generating a comparison value output (223) based at least in part on the comparison of the field voltage value (219) and the generated reference voltage (221); and determining one of a plurality of field conditions based at least in part on the comparison value output (223). In an example embodiment, the at least one of the plurality of field conditions include a second contact conductor (205) connected to a ground. In an example embodiment, the controller (268) is further configured for receiving one or more digital comparison signals based at least in part on comparing one or more of the monitored first or second voltage potentials with one or more analog reference signals.

Accordingly, example embodiments of the invention can provide the technical effects of creating certain systems and methods that provide detection of field wire faults. Example embodiments of the invention can provide the further technical effects of providing systems and methods for determining ground fault detection.

In example embodiments of the invention, the fault detection system 100 and/or the fault detection circuitry 200 may include any number of hardware and/or software applications that are executed to facilitate any of the operations.

In example embodiments, one or more I/O interfaces may facilitate communication between the fault detection system 100 and/or the fault detection circuitry 200 and one or more input/output devices. For example, a universal serial bus port, a serial port, a disk drive, a CD-ROM drive, and/or one or more user interface devices, such as a display, keyboard, keypad, mouse, control panel, touch screen display, microphone, etc., may facilitate user interaction with the fault detection system 100 and/or the fault detection circuitry 200. The one or more I/O interfaces may be utilized to receive or collect data and/or user instructions from a wide variety of input devices. Received data may be processed by one or more computer processors as desired in various embodiments of the invention and/or stored in one or more memory devices.

One or more network interfaces may facilitate connection of the fault detection system 100 and/or the fault detection circuitry 200 inputs and outputs to one or more suitable networks and/or connections; for example, the connections that facilitate communication with any number of sensors associated with the system. The one or more network interfaces may further facilitate connection to one or more suitable networks; for example, a local area network, a wide area network, the Internet, a cellular network, a radio frequency network, a Bluetooth™ (owned by Telefonaktiebolaget LM Ericsson) enabled network, a Wi-Fi™ (owned by Wi-Fi Alliance) enabled network, a satellite-based network any wired network, any wireless network, etc., for communication with external devices and/or systems.

As desired, embodiments of the invention may include the fault detection system 100 and/or the fault detection circuitry 200 with more or less of the components illustrated in FIGS. 1 and 2.

The invention is described above with reference to block and flow diagrams of systems and methods and/or computer program products according to example embodiments of the invention. It will be understood that one or more blocks of the block diagrams and flow diagrams, and combinations of blocks in the block diagrams and flow diagrams, respectively, can be implemented by computer-executable program instructions. Likewise, some blocks of the block diagrams and flow diagrams may not necessarily need to be performed in the order presented, or may not necessarily need to be performed at all, according to some embodiments of the invention.

These computer-executable program instructions may be loaded onto a general-purpose computer, a special-purpose computer, a processor, or other programmable data processing apparatus to produce a particular machine, such that the instructions that execute on the computer, processor, or other programmable data processing apparatus create means for implementing one or more functions specified in the flow diagram block or blocks. These computer program instructions may also be stored in a computer-readable memory that can direct a computer or other programmable data processing apparatus to function in a particular manner, such that the instructions stored in the computer-readable memory produce an article of manufacture including instruction means that implement one or more functions specified in the flow diagram block or blocks. As an example, embodiments of the invention may provide for a computer program product, comprising a computer-usable medium having a computer-readable program code or program instructions embodied therein, said computer-readable program code adapted to be executed to implement one or more functions specified in the flow diagram block or blocks. The computer program instructions may also be loaded onto a computer or other programmable data processing apparatus to cause a series of operational elements or steps to be performed on the computer or other programmable apparatus to produce a computer-implemented process such that the instructions that execute on the computer or other programmable apparatus provide elements or steps for implementing the functions specified in the flow diagram block or blocks.

Accordingly, blocks of the block diagrams and flow diagrams support combinations of means for performing the specified functions, combinations of elements or steps for performing the specified functions and program instruction means for performing the specified functions. It will also be understood that each block of the block diagrams and flow diagrams, and combinations of blocks in the block diagrams and flow diagrams, can be implemented by special-purpose, hardware-based computer systems that perform the specified functions, elements or steps, or combinations of special-purpose hardware and computer instructions.

While the invention has been described in connection with what is presently considered to be the most practical and various embodiments, it is to be understood that the invention is not to be limited to the disclosed embodiments, but on the contrary, is intended to cover various modifications and equivalent arrangements included within the scope of the appended claims. Although specific terms are employed herein, they are used in a generic and descriptive sense only and not for purposes of limitation.

This written description uses examples to disclose the invention, including the best mode, and also to enable any person skilled in the art to practice the invention, including making and using any devices or systems and performing any incorporated methods. The patentable scope of the invention is defined in the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The invention claimed is:

1. A method for determining faults, comprising:
providing a voltage source having a positive lead coupled to a first conductor and a negative lead coupled to a second conductor, wherein the first conductor is connected to a ground through a first resistor, and wherein the second conductor is connected to the ground through a second resistor;
providing a fault detector circuit comprising a voltage comparator having a first input coupled to the first conductor and a second input coupled to the second conductor; and
generating from the fault detector circuit, an output signal representing a voltage difference between the first and second inputs of the voltage comparator, for detecting at least one of: a) the first conductor having at least one of a connection or a current leakage to the ground, b) the second conductor having at least one of a connection or a current leakage to the ground, or c) the first conductor and the second conductor connected to each other.

2. The method of claim 1, further comprising:
providing a reference voltage to the fault detector circuit;
using the reference voltage in the voltage comparator to generate the output signal at a first voltage level that is indicative of the first conductor connected to the ground.

3. The method of claim 1, further comprising:
monitoring a voltage potential associated with the output signal;
monitoring a voltage potential associated with the voltage source; and
determining a condition associated with at least one of the first or the second conductor, based at least in part on the monitored voltage potential associated with the output signal and the monitored voltage associated with the voltage source.

4. The method of claim 3, wherein determining a condition associated with the at least one of the first or the second conductor comprises determining if the at least one of the first or the second conductor is connected to the ground or if the at least one of the first or the second conductor develops leakage to the ground.

5. The method of claim 4, wherein the output signal is monitored with respect to the ground.

6. The method of claim 3, wherein the monitored voltage associated with the voltage source is monitored with respect to the ground.

7. The method of claim 1, wherein the voltage source comprises a battery.

8. A method for determining faults, comprising:
providing a voltage source having a positive lead coupled to a first conductor and a negative lead coupled to a second conductor, wherein the first conductor is connected to a ground through a first resistor, and wherein the second conductor is connected to the ground through a second resistor;
providing a fault detector circuit comprising a voltage comparator having a first input coupled to the first conductor and a second input coupled to the second conductor;
using one of a controller or a microprocessor to generate a reference voltage value based at least in part on a power source reference received by the one of the controller or the microprocessor from the voltage source;
generating a comparison value output from the fault detector circuit based at least in part on the comparison of a voltage value present in one of the first conductor or the second conductor and the generated reference voltage value; and
determining from the comparison value output at least one of: a) that the first conductor has at least one of a connection or a current leakage to the ground, b) that the second conductor has at least one of a connection or a current leakage to the ground, or c) that the first conductor and the second conductor are connected to each other.

9. The method of claim 8, wherein the reference voltage value generated by the one of a controller or a microprocessor is a digital reference voltage signal and wherein the fault detector circuit includes a digital-to-analog converter that converts the digital reference voltage signal into an analog reference voltage signal that is used by the voltage comparator to generate the comparison value output.

10. The method of claim 8, wherein the reference voltage value is based on a battery voltage of a battery in the voltage source.

11. A system comprising:
a voltage source;
a fault detector circuit comprising a voltage comparator;
a first conductor coupled to a positive side of the voltage source and to a first input of the voltage comparator;
a second conductor coupled to a negative side of the voltage source and to a second input of the voltage comparator;
a first resistor having a proximal end coupled to ground, and a distal end coupled to the positive side of the voltage source and to the first input of the voltage comparator; and
a second resistor having a proximal end coupled to ground, and a distal end coupled to the negative side of the voltage source and to the second input of the voltage comparator,
wherein the fault detector circuit is configured to provide an output signal representing a voltage difference between the first and second inputs of the voltage comparator, for detecting of at least one of: a) the first conductor having at least one of a short to ground or a current leakage to ground, b) the second conductor having at least one of a short to ground or a current leakage to ground, or c) the first conductor and the second conductor shorted to each other.

12. The system of claim 11, wherein the voltage source comprises a battery.

13. The system of claim 11, further comprising:
a controller configured for
receiving a power source reference;
comparing the power source reference to the output signal provided by the fault detector circuit;
generating a comparison value output based at least in part on the comparing; and
determining at least one of a plurality of conditions of the first and the second conductors based at least in part on the comparison value output.

14. The system of claim 13, wherein at least one of the plurality of field conditions comprises the second conductor connected to ground or conducting leakage current to ground.

15. The system of claim 11, wherein the first input and the second input of the voltage comparator are at different voltage levels when one of the first conductor or the second conductor is shorted to ground.

16. The system of claim 11, wherein the first input and the second input of the voltage comparator are at a same voltage level when the first conductor and the second conductor are shorted to each other.

17. The system of claim 11, further comprising:
a power supply voltage interface circuit; and
a controller configured to receive the output signal from the fault detector circuit and a power reference signal from the power supply voltage interface circuit, the controller further configured to compare the output signal from the fault detector circuit to the power reference signal and generate therefrom a threshold voltage level signal.

18. The system of claim 17, wherein the power supply voltage interface circuit comprises an analog-to-digital converter that is coupled to the voltage source, the analog-to-digital converter configured to sense a voltage level of the power source and generate the power reference signal in a digital format for providing to the controller.

19. The system of claim 17, wherein the threshold voltage level signal generated by the controller is a digital threshold voltage level signal.

20. The system of claim 19, wherein the fault detector circuit further comprises a digital-to-analog converter configured to receive the digital threshold voltage level signal from the controller and convert the threshold voltage level signal into an analog threshold voltage level signal that is used by the fault detector circuit to generate the output signal.

* * * * *